US008697523B2

(12) United States Patent
Cai et al.

(10) Patent No.: US 8,697,523 B2
(45) Date of Patent: Apr. 15, 2014

(54) INTEGRATION OF SMT IN REPLACEMENT GATE FINFET PROCESS FLOW

(75) Inventors: Ming Cai, Hopewell Junction, NY (US); Dechao Guo, Fishkill, NY (US); Chun-Chen Yeh, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 47 days.

(21) Appl. No.: 13/366,904

(22) Filed: Feb. 6, 2012

(65) Prior Publication Data

US 2013/0200468 A1     Aug. 8, 2013

(51) Int. Cl.
*H01L 29/06*     (2006.01)

(52) U.S. Cl.
USPC ........... 438/283; 438/157; 438/592; 438/322; 438/197; 438/154; 257/E21.616; 257/E27.06; 257/190; 257/365; 257/412; 257/288; 257/347

(58) Field of Classification Search
USPC ............... 257/190, 347, 408, 77, 288, 369; 438/322, 197, 154, 285, 300
See application file for complete search history.

(56) References Cited

U.S. PATENT DOCUMENTS

| 7,198,995 | B2 | 4/2007 | Chidambarrao et al. |
| 7,341,902 | B2 | 3/2008 | Anderson et al. |
| 7,488,670 | B2 | 2/2009 | Knoefler et al. |
| 7,566,655 | B2 | 7/2009 | Balseanu et al. |
| 7,678,630 | B2 | 3/2010 | Lindsay |
| 7,923,337 | B2 | 4/2011 | Chang et al. |
| 2005/0090066 | A1* | 4/2005 | Zhu et al. ........... 438/300 |
| 2006/0160317 | A1* | 7/2006 | Zhu et al. ........... 438/322 |
| 2007/0122984 | A1* | 5/2007 | Zhu et al. ........... 438/285 |
| 2008/0173942 | A1 | 7/2008 | Zhu et al. |
| 2008/0261355 | A1* | 10/2008 | Goktepeli et al. ........... 438/154 |
| 2008/0286916 | A1* | 11/2008 | Luo et al. ........... 438/197 |
| 2009/0001415 | A1 | 1/2009 | Lindert et al. |
| 2009/0001476 | A1* | 1/2009 | Pei ........... 257/369 |
| 2009/0050942 | A1* | 2/2009 | Liu et al. ........... 257/288 |
| 2009/0242990 | A1 | 10/2009 | Saitoh et al. |
| 2009/0321836 | A1 | 12/2009 | Wei et al. |
| 2010/0059764 | A1* | 3/2010 | Luo et al. ........... 257/77 |

(Continued)

OTHER PUBLICATIONS

Fried et al., Comparison study of FinFETs: SOI vs. Bulk: Performance, Manufacturing Variability and Cost, SOI industry Consortium (2011).

(Continued)

*Primary Examiner* — Jerome Jackson, Jr.
*Assistant Examiner* — Bo Fan
(74) *Attorney, Agent, or Firm* — Vazken Alexanian; Michael J. Chang, LLC

(57) ABSTRACT

A method of fabricating a FINFET includes the following steps. A plurality of fins is patterned in a wafer. A dummy gate is formed covering a portion of the fins which serves as a channel region. Spacers are formed on opposite sides of the dummy gate. The dummy gate is removed thus forming a trench between the spacers that exposes the fins in the channel region. A nitride material is deposited into the trench so as to cover a top and sidewalls of each of the fins in the channel region. The wafer is annealed to induce strain in the nitride material thus forming a stressed nitride film that covers and induces strain in the top and the sidewalls of each of the fins in the channel region of the device. The stressed nitride film is removed. A replacement gate is formed covering the fins in the channel region.

18 Claims, 6 Drawing Sheets

(56) References Cited

U.S. PATENT DOCUMENTS

2010/0230765 A1* 9/2010 Quek et al. .................. 257/408
2012/0025312 A1* 2/2012 Scheiper et al. ............. 257/347
2012/0264261 A1* 10/2012 Zhu et al. .................... 438/197

OTHER PUBLICATIONS

Lis, et al., "Application of flowable oxides in photonics," Materials Science-Poland, vol. 26, No. 1 (2008).

Chung et al., "Flowable Oxide CVD Process for Shallow Trench Isolation in Silicon Semiconductor," Journal of Semiconductor Technology and Science, vol. 4, No. 1 (Mar. 2004).

Chen et al., "Stress Memorization Technique (SMT) by Selectively Strained-Nitride Capping for Sub-65nm High-Performance Strained-Si Device Application," 2004 Symposium on VLSI Technology Digest of Technical Papers, pp. 56-57 (2004).

Tan et al., "Drive-Current Enhancement in FinFETs Using Gate-Induced Stress," IEEE Electron Device Letters, vol. 27, No. 9, pp. 769-771 (Sep. 2006).

Liow et al., "Strained N-Channel FinFETs with 25 nm Gate Length and Silicon-Carbon Source/Drain Regions for Performance Enhancement," 2006 Symposium on VLSI Technology Digest of Technical Papers, pp. 68-69 (2006).

* cited by examiner

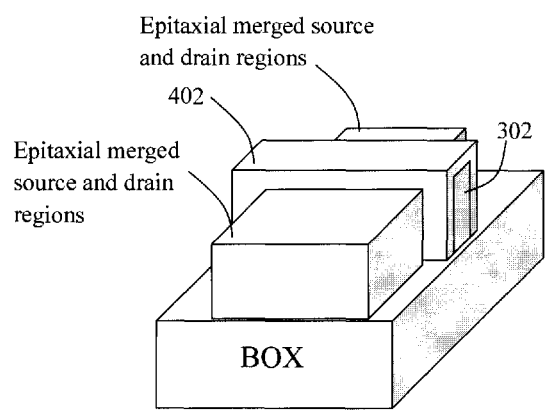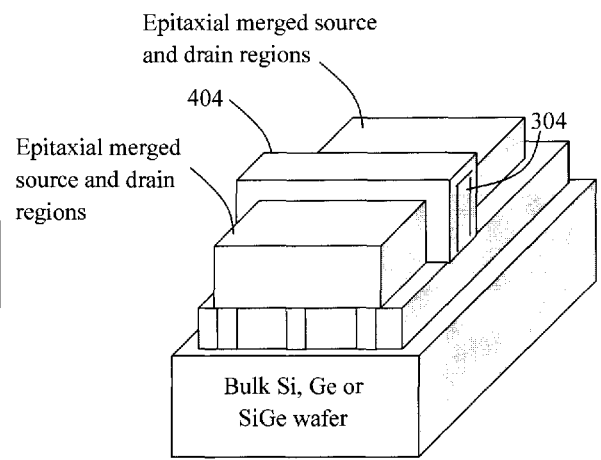
FIG. 5A    FIG. 5B
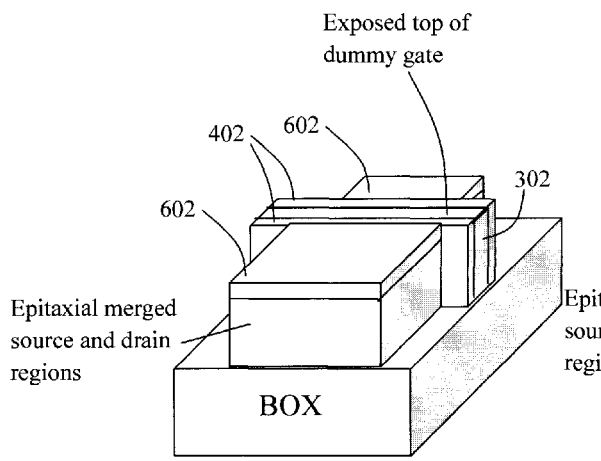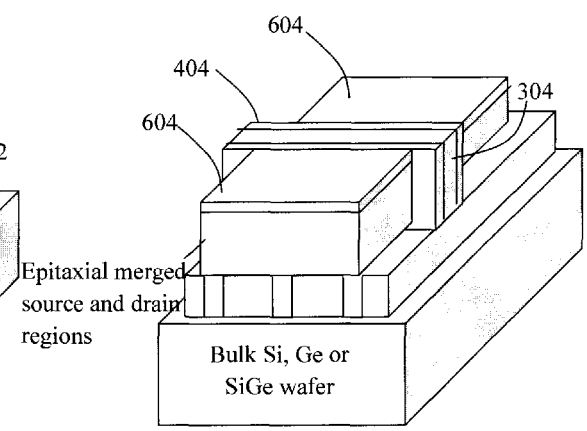
FIG. 6A    FIG. 6B

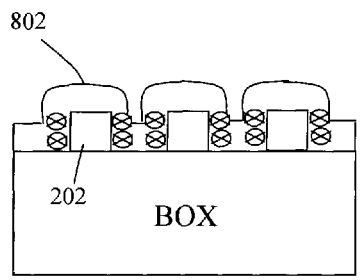
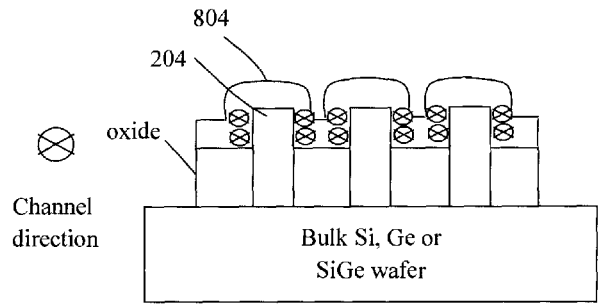
FIG. 8A
FIG. 8B
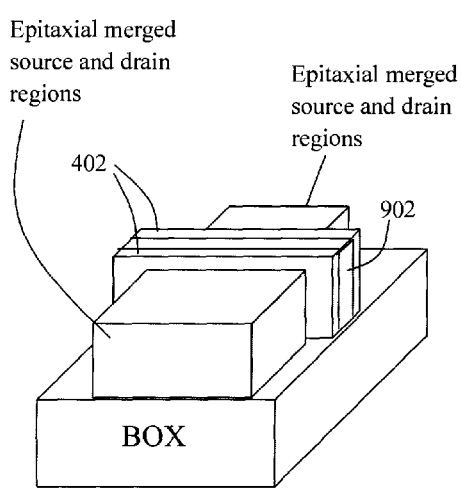
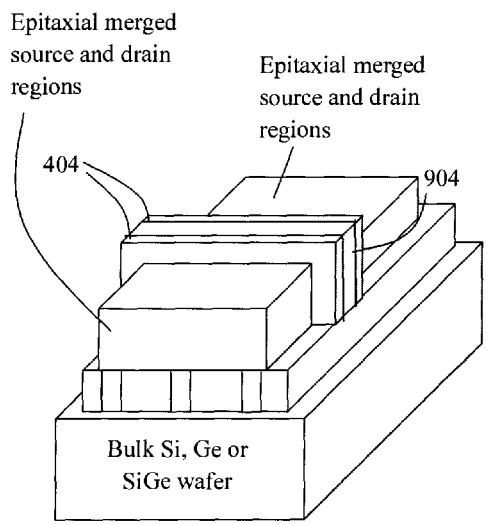
FIG. 9A
FIG. 9B

US 8,697,523 B2

INTEGRATION OF SMT IN REPLACEMENT GATE FINFET PROCESS FLOW

FIELD OF THE INVENTION

The present invention relates to FIN field effect transistor (FINFET) devices and more particularly, to techniques for employing stress memorization techniques (SMT) in a FINFET device fabrication process.

BACKGROUND OF THE INVENTION

Stress memorization techniques (SMT) have been proven to work on planar complementary metal oxide semiconductor (CMOS) technologies such as n-channel field effect transistors (NFETs). By imparting stress into the transistors during fabrication, increased electron mobility is experienced. In general, SMT processes on NFETs involve transferring stress from a high-stress nitride to the source and drain regions of the NFETs by way of a high-temp anneal, and then stripping the high-stress nitride.

The traditional SMT procedure, however, is unlikely to work for future generation CMOS technologies that involve a FINFET structure. A FINFET device typically includes a source region and a drain region interconnected by a plurality of fins which serve as a channel region of the device. A gate surrounds at least a portion of each of the fins in between the source and drain regions. Epitaxy is typically used to merge the fins in the source and drain regions. The traditional SMT procedure is likely not suitable for use in FINFET devices because, unlike planar devices, in FINFETs the channel runs along the sidewalls of the fins. Thus, the channel will be a distance away from any high-stress nitride when deposited on the merged epitaxial source and drain regions.

Therefore, improved SMT techniques for use with FINFET devices would be desirable.

SUMMARY OF THE INVENTION

The present invention provides techniques for employing stress memorization techniques (SMT) in a FIN field effect transistor (FINFET) device fabrication process. In one aspect of the invention, a method of fabricating a FINFET device is provided. The method includes the following steps. A wafer is provided. A plurality of fins is patterned in the wafer. A dummy gate is formed covering a portion of the fins, wherein the portion of the fins covered by the dummy gate serves as a channel region of the device and portions of the fins extending out from under the dummy gate serve as source and drain regions of the device. Spacers are formed on opposite sides of the dummy gate. The dummy gate is removed thus forming a trench between the spacers that exposes the fins in the channel region of the device. A nitride material is deposited into the trench so as to cover a top and sidewalls of each of the fins in the channel region of the device. The wafer is annealed to induce strain in the nitride material thus forming a stressed nitride film that covers and induces strain in the top and the sidewalls of each of the fins in the channel region of the device. The stressed nitride film is removed. A replacement gate is formed covering the fins in the channel region of the device.

In another aspect of the invention, a FINFET device is provided. The FINFET device includes a plurality of fins formed in a wafer; a gate covering a portion of the fins, wherein the portion of the fins covered by the gate serves as a channel region of the device and portions of the fins extending out from under the gate serve as source and drain regions of the device, and wherein a top and sidewalls of each of the fins in the channel region of the device have induced strain; and spacers on opposite sides of the gate.

A more complete understanding of the present invention, as well as further features and advantages of the present invention, will be obtained by reference to the following detailed description and drawings.

BRIEF DESCRIPTION OF THE DRAWINGS

FIG. 5A is a three-dimensional diagram illustrating epitaxy having been used to thicken/merge the exposed portions of the fins forming source and drain regions of the device in the SOI wafer configuration according to an embodiment of the present invention;

FIG. 5B is a three-dimensional diagram illustrating epitaxy having been used to thicken/merge the exposed portions of the fins forming source and drain regions of the device in the bulk wafer configuration according to an embodiment of the present invention;

FIG. 6A is a three-dimensional diagram illustrating a nitride layer having been deposited onto the wafer covering the epitaxially merged source and drain regions and the dummy gate in the SOI wafer configuration according to an embodiment of the present invention;

FIG. 6B is a three-dimensional diagram illustrating a nitride layer having been deposited onto the wafer covering the epitaxially merged source and drain regions and the dummy gate in the bulk wafer configuration according to an embodiment of the present invention;

FIG. 8A is a cross-sectional diagram illustrating a high-stress nitride film having been deposited onto the fins in the channel region in the SOI wafer configuration according to an embodiment of the present invention;

FIG. 8B is a cross-sectional diagram illustrating a high-stress nitride film having been deposited onto the fins in the channel region in the bulk wafer configuration according to an embodiment of the present invention;

FIG. 9A is a three-dimensional diagram illustrating a replacement gate having been formed in the SOI wafer configuration according to an embodiment of the present invention; and FIG. 9B is a three-dimensional diagram illustrating a replacement gate having been formed in the bulk wafer configuration according to an embodiment of the present invention.

DETAILED DESCRIPTION OF PREFERRED EMBODIMENTS

Figure 1A:
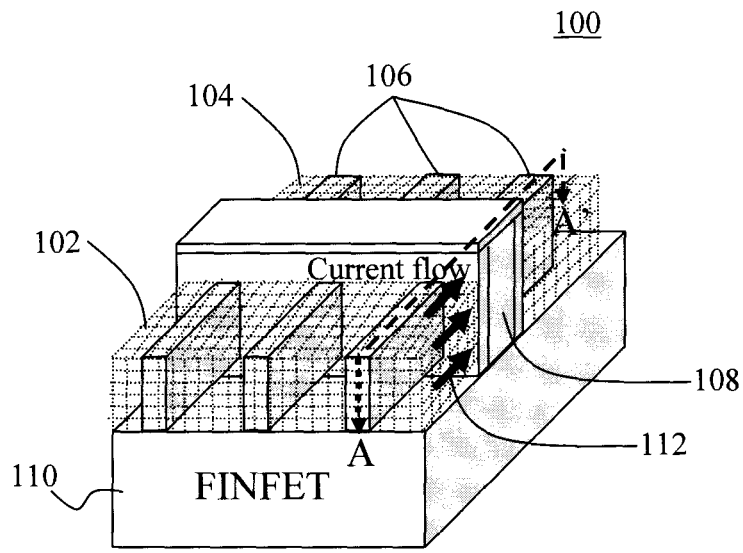
FIG. 1A is a three-dimensional diagram illustrating how in a FINFET device current flow through the channel occurs vertically along the sidewalls of the fins according to an embodiment of the present invention.
Figure 1B:
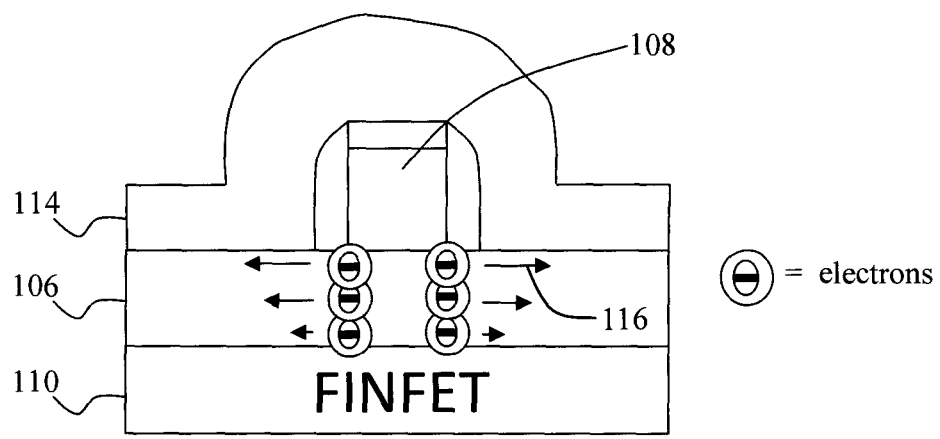
FIG. 1B is a diagram illustrating a cross-sectional cut through the structure in FIG. 1A according to an embodiment of the present invention.

Provided herein are techniques for the fabrication of a FIN field effect transistor (FINFET) device that employ stress memorization techniques (SMTs). FIGS. 1A and 1B are provided to illustrate why traditional SMT processes are likely not applicable to FINFET devices. Specifically, FIG. 1A illustrates a FINFET device 100 having source region 102 and a drain region 104 interconnected by fins 106 which serve as a channel region of the device. A gate 108 surrounds at least a portion of each of the fins in between the source region 102 and drain region 104. The device is formed on a substrate 110.

As shown in FIG. 1A, the current flow through the channel occurs vertically along the sidewalls of the fins (see arrows 112). Thus, if a high-stress nitride 114 were to be deposited on the device, the high-stress nitride would be spaced a distance apart from the channel. See FIG. 1B. FIG. 1B is a diagram illustrating a cross-sectional cut through line A-A' of FIG. 1A. As shown in FIG. 1B, the electron flow is vertical along the sidewalls of the fins (see arrows 116). Thus, high-stress nitride 114 does not reach the channel using this scheme. Even if the high-stress nitride 114 does couple the stress into the channel, the strain effect will be non-uniform from the top of the fins to the bottom. This is another source of the process variation which may cause yield problems in manufacturing. The present techniques provide uniform stress transfer along the fin height direction.

The present techniques employ an intermediate dummy gate structure which can be removed prior to the SMT procedure and then replaced with a replacement gate. In this manner, with the dummy gate removed the entire surface area of the fin channel is exposed to the high-stress nitride. The stress can then be effectively transferred to the channel by an anneal step, followed by placement of the replacement gate. The process will now be described in detail by reference to FIGS. 2-9.

Figure 2A:
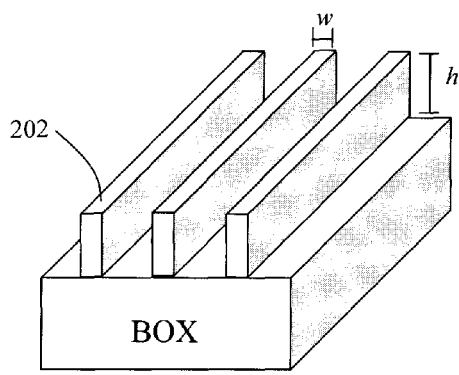
FIG. 2A is a three-dimensional diagram illustrating a plurality of fins having been patterned in a silicon-on-insulator (SOI) wafer according to an embodiment of the present invention.
Figure 2B:
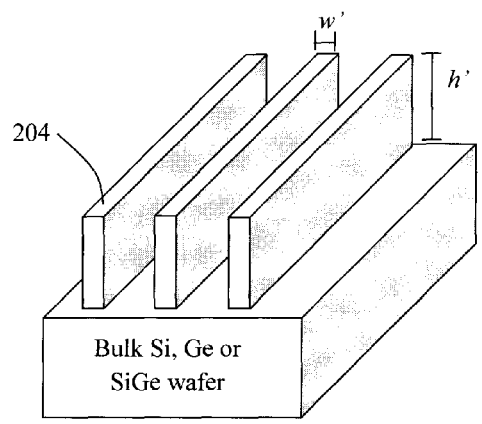
FIG. 2B is a three-dimensional diagram illustrating an alternative embodiment wherein a plurality of fins have been patterned in a bulk semiconductor wafer according to an embodiment of the present invention.
Figure 2C:
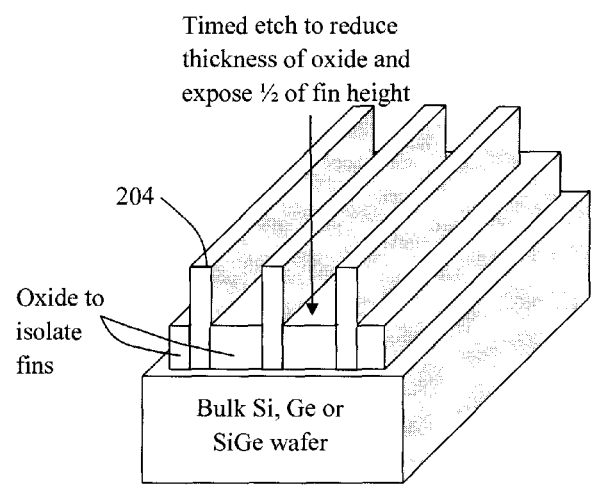
FIG. 2C is a three-dimensional diagram illustrating an oxide being used to isolate the fins in the bulk wafer configuration according to an embodiment of the present invention.

To begin the process, a plurality of fins 202 is first patterned on a wafer. See FIGS. 2A and 2B illustrating a silicon-on-insulator (SOI) and bulk semiconductor wafer, respectively. The following description regarding the wafer and the processes for fabricating the fins on the wafer are merely exemplary. Any suitable wafer configuration and fin fabrication process for forming a FINFET device may be employed herein.

By way of example only, a suitable starting platform is a SOI wafer having a SOI layer separated from a substrate by a buried oxide or BOX (e.g., silicon dioxide). For ease of depiction, the substrate is not shown in the figures. See FIG. 2A.

The SOI layer may include semiconductor materials, such as silicon, germanium or silicon germanium. Such SOI wafers are commercially available. The thickness of the SOI layer will dictate the height of the fins. Thus, if a commercial wafer is employed, it might be necessary to thin the SOI layer. By way of example only, the SOI layer can be thinned using a series of oxidation and oxide strip steps, as known in the art, until a desired thickness (see below) is attained.

Next, as shown in FIG. 2A, a plurality of fins 202 is patterned in the SOI layer. By way of example only, this patterning step can involve depositing a hardmask (not shown) onto the SOI layer and patterning the hardmask with the footprint and location of the fins. The hardmask can then be used to pattern the fins in the SOI layer using, for example, a reactive ion etching process. Any remaining hardmask after the fin etch may be removed using an etching process, such as chemical mechanical polishing (CMP).

According to an exemplary embodiment, a nitride hardmask is used to pattern the fins. Additionally, a dual fin hardmask structure (e.g., that includes both an oxide and a nitride component) may be employed to enhance the definition of the resulting fins. Dual fin hardmask structures are described, for example, in U.S. Pat. No. 7,923,337 B2, entitled "Fin Field Effect Transistor Devices with Self-Aligned Source and Drain Regions," issued to Chang et al., (hereinafter "Chang") the contents of which are incorporated by reference herein.

According to an exemplary embodiment, the fins 202 are patterned having a height h of from about 10 nanometers (nm) to about 30 nm and a width w of from about 10 nm to about 25 nm. As described above, the thickness of the SOI layer will equal the height h of the patterned fins. Thus, according to an exemplary embodiment, the thickness of the SOI layer (prior to patterning the fins 202) is from about 10 nm to about 30 nm. As described above, a thinning process may be needed to reduce the thickness of the SOI layer.

An alternative starting platform for the present FINFET device fabrication process is a bulk semiconductor (e.g., silicon (Si), germanium (Ge) or silicon germanium (SiGe)) wafer. See FIG. 2B. As shown in FIG. 2B, starting with the bulk wafer, a plurality of fins 204 are patterned in the wafer.

By way of example only, this patterning step can involve depositing a hardmask (not shown) onto the surface of the wafer and patterning the hardmask with the footprint and location of the fins. The hardmask can then be used to pattern the fins in the wafer using, for example, a high-aspect-ratio fin reactive ion etching (RIE) process. According to an exemplary embodiment, the fins in this example are formed having a height h' of from about 40 nm to about 70 nm, e.g., about 60 nm, and a width w' of from about 10 nm to about 25 nm. A portion (e.g., about half) of each of the fins will be buried with an isolation oxide (see below) thus reducing the effective height of each fin to from about 20 nm to about 35 nm, e.g., about 30 nm.

According to an exemplary embodiment, a nitride hardmask is used to pattern the fins. Additionally, a dual fin hardmask structure (e.g., that includes both an oxide and a nitride component) may be employed to enhance the definition of the resulting fins. See Chang.

After the fins are patterned in the bulk wafer, in order to isolate the fins, an oxide material (e.g., silicon dioxide ($SiO_2$)) is first blanket deposited onto the wafer, filling the spaces between the fins 204. A suitable process for depositing the oxide material includes, but is not limited to, chemical vapor deposition (CVD). Excess deposited oxide can be removed using a process such as CMP. Next, an oxide selective, timed etch (e.g., a timed, oxide-selective RIE) is used to recess the oxide so as to expose a portion of the fins. See FIG. 2C. This oxide etch may also serve to remove any hardmask remaining from the fin etch (described above).

According to an exemplary embodiment, the oxide etch is end-pointed when half of the height h' of the fins is exposed. Thus, using the exemplary dimensions provided above, when the fins are patterned in the bulk wafer each having a height h' of from about from about 40 nm to about 70 nm, then the oxide RIE is end-pointed when from about 20 nm to about 35 nm of fin is exposed.

The oxide will provide insulation between the fins. However, as is apparent from FIG. 2C, the fins are still connected below the oxide. A high-dose junction angled implant into the base of each fin can be used to create a dopant junction and thus completely isolate the fins. By way of example only, a high-dose junction angled implant may include implanting arsenic (As) at a dose of from about $1 \times 10^{16}$ cm$^{-2}$ to about $3 \times 10^{16}$ cm$^{-2}$ into the base of each fin. This type of fin isolation is commonly referred to as junction isolation. See, for example, Fried et al., "Comparison study of FinFETs: SOI vs. Bulk: Performance, Manufacturing Variability and Cost, SOI industry Consortium (2011), the contents of which are incorporated by reference herein.

As will become apparent from the following description, a portion of the fins 202/204 will be used to form a channel region of the device, i.e., those portions of the fins 202/204 covered by a dummy/replacement gate. Other portions of the fins will form source and drain regions of the device (i.e., those portions of the fins extending out from under the dummy/replacement gate).

Figure 3A:
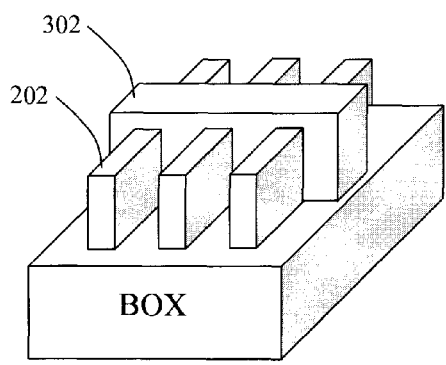
FIG. 3A is a three-dimensional diagram illustrating a dummy gate having been formed over/covering a portion of each of the fins in the SOI wafer configuration according to an embodiment of the present invention.
Figure 3B:
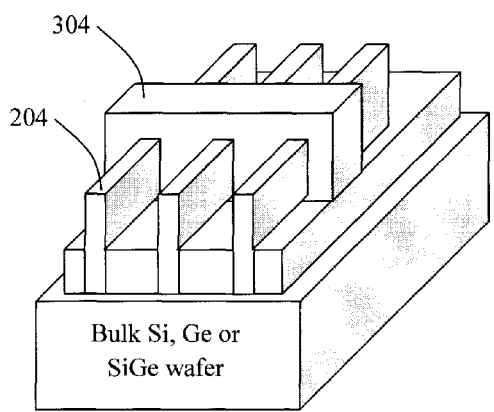
FIG. 3B is a three-dimensional diagram illustrating a dummy gate having been formed over/covering a portion of each of the fins in the bulk wafer configuration according to an embodiment of the present invention.

Regardless of which starting platform for the process is used, i.e., SOI or bulk wafer, the remaining steps are performed in the same manner. Namely, next, a dummy gate 302/304 is formed over/covering a portion of each of the fins. See FIGS. 3A and 3B, respectively. FIG. 3A (which follows from FIG. 2A) depicts the SOI wafer embodiment, whereas FIG. 3B (which follows from FIG. 2C) depicts the bulk wafer embodiment. Steps will be taken later in the process to remove the dummy gate and replace it with a replacement gate. Thus, the dummy gate merely serves as a placeholder for the subsequent replacement gate. The dummy gate concept is also described in Chang.

According to an exemplary embodiment, the dummy gate 302/304 is formed by first blanket depositing a suitable dummy gate material onto the wafer, covering the fins. Suitable dummy gate materials include, but are not limited to, poly-silicon. The dummy gate material might be deposited using a chemical vapor deposition (CVD) process, such as low pressure CVD (LPCVD). A resist (not shown) may then be deposited onto the dummy gate material and the resist may be patterned with the footprint and location of the dummy gate 302/304. An etching process, such as RIE, can then be used to pattern the dummy gate 302/304. By way of example only, when poly-silicon is employed as the dummy gate material, a poly-silicon-selective RIE might be used in this step to pattern the dummy gate 302/304.

Figure 4A:
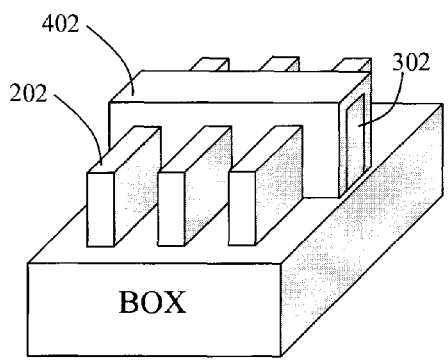
FIG. 4A is a three-dimensional diagram illustrating spacers having been formed on opposite sides of the dummy gate in the SOI wafer configuration according to an embodiment of the present invention.

Spacers 402/404 are then formed on opposite sides of the dummy gate 302/304. See FIGS. 4A and 4B, respectively. FIG. 4A (which follows from FIG. 3A) depicts the SOI wafer embodiment, whereas FIG. 4B (which follows from FIG. 3B) depicts the bulk wafer embodiment. Placing spacers between what will be the source and drain regions of the device and the device gate (as highlighted above, the dummy gate 302/304 serves as a placeholder for what will be a final/replacement gate of the device) will help to minimize parasitic capacitance in the completed device, but is not necessary for preventing gate-to-source/drain shorting during the source/drain epitaxy (see below). Thus, the spacers 402/404 serve primarily to offset the gate a certain distance from the source and drain regions. Without the spacers 402/404, the source/drain silicide (see below) may encroach into the channel region causing high resistance and/or unwanted source/drain dopant overrun.

Figure 4B:
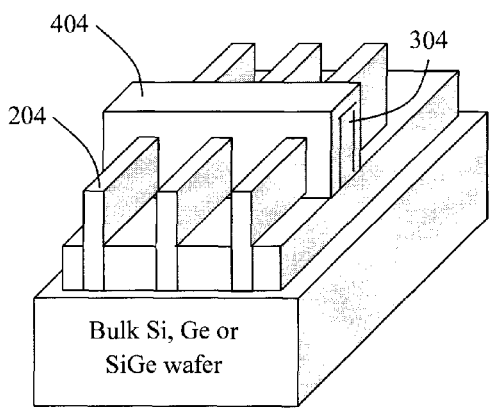
FIG. 4B is a three-dimensional diagram illustrating spacers having been formed on opposite sides of the dummy gate in the bulk wafer configuration according to an embodiment of the present invention.

According to an exemplary embodiment, the spacers 402/404 are nitride spacers and are formed by first depositing a nitride layer (e.g., a silicon nitride layer) over the wafer, covering the dummy gate 302/304. A resist film is then deposited onto the nitride layer, masked and then patterned with the spacer footprint. A nitride-selective RIE can then be used to form the spacers 402/404. As shown in FIGS. 4A and 4B, this process will leave a portion of the spacer material on top of the dummy gate. This portion of the spacer material on top of the dummy gate 302/304 will be removed later in the process during an etch to expose the dummy gate 302/304.

Epitaxy is then used to thicken the exposed portions of the fins in the source and drain regions of the device (i.e., those portions of the fins not covered by the dummy gate 302/304 and/or spacers 402/404). See FIGS. 5A and 5B, respectively. FIG. 5A (which follows from FIG. 4A) depicts the SOI wafer embodiment, whereas FIG. 5B (which follows from FIG. 4B) depicts the bulk wafer embodiment. As shown in FIGS. 5A and 5B, this epitaxy step serves to merge the fins. A standard epitaxy process may be employed, as known in the art. In general, however, epitaxy involves the growth of a film from a gaseous or liquid precursor, such as silicon tetrachloride. Dopants may be introduced during the epitaxy process if so desired to dope the source and drain regions. Suitable dopants include, but are not limited to, boron and phosphorous.

An oxide layer 602/604 is then deposited onto the wafer covering the epitaxially merged source and drain regions. See FIGS. 6A and 6B, respectively. FIG. 6A (which follows from FIG. 5A) depicts the SOI wafer embodiment, whereas FIG. 6B (which follows from FIG. 5B) depicts the bulk wafer embodiment. As will be described in detail below, the oxide layer 602/604 serves to protect the source and drain regions during the gate removal process to follow. Also, the oxide layer 602/604 can be subsequently removed (see below) selective to the spacers 402/404 thus leaving the spacers 402/404 intact.

According to an exemplary embodiment, the oxide layer 602/604 is formed from a flowable oxide. Suitable flowable oxides include, but are not limited to, polymer hydrogen silsesquioxane (HSQ) in a solvent such as methyl isobutyl ketone (MIBK), e.g., FOX available from Dow Corning, and liquid Si(OH)$_4$. Polymer HSQ is described, for example, in Lis, et al., "Application of flowable oxides in photonics," Materials Science-Poland, vol. 26, No. 1 (2008) (hereinafter "Lis"), the contents of which are incorporated by reference herein. As is described in Lis, the polymer HSQ (such as FOX) can be spin coated on the wafer, in this case covering the epitaxially merged source and drain regions. The polymer HSQ can then be baked at a temperature of from about 100° C. to about 250° C. for a duration of from about 2 minutes to about 10 minutes to remove the solvent and densify the layer. The deposition of liquid Si(OH)$_4$ using chemical vapor deposition (CVD) is described, for example, in Chung et al., "Flowable Oxide CVD Process for Shallow Trench Isolation in Silicon Semiconductor," Journal of Semiconductor Technology and Science, vol. 4, No. 1 (March 2004) (hereinafter "Chung"), the contents of which are incorporated by reference herein.

According to an exemplary embodiment, the oxide material (e.g., flowable oxide) is blanket deposited onto the wafer.

Excess material can be removed (e.g., using a developer wash such as a Tetramethyl-ammonium hydroxide (TMAH) based developer) from all but those areas over the source and drain regions, thus forming the oxide layer 602/604.

As shown in FIGS. 6A and 6B, an etch, e.g., CMP, is performed to remove the spacer material from the top of the dummy gate, thus exposing the dummy gate. The oxide layer 602/604 acts as an etch stop during this step.

Figure 7A:
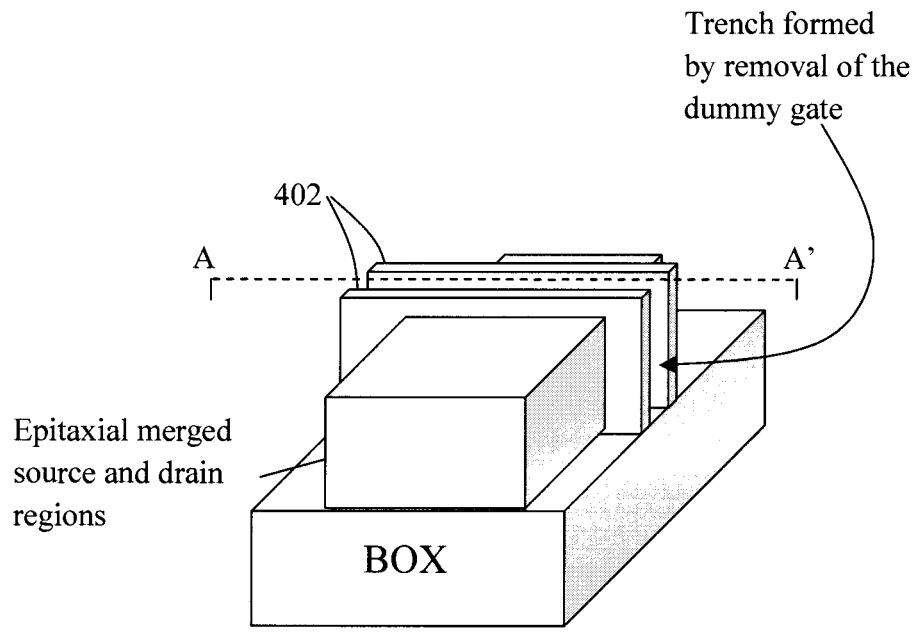
FIG. 7A is a three-dimensional diagram illustrating the dummy gate having been removed in the SOI wafer configuration according to an embodiment of the present invention.
Figure 7B:
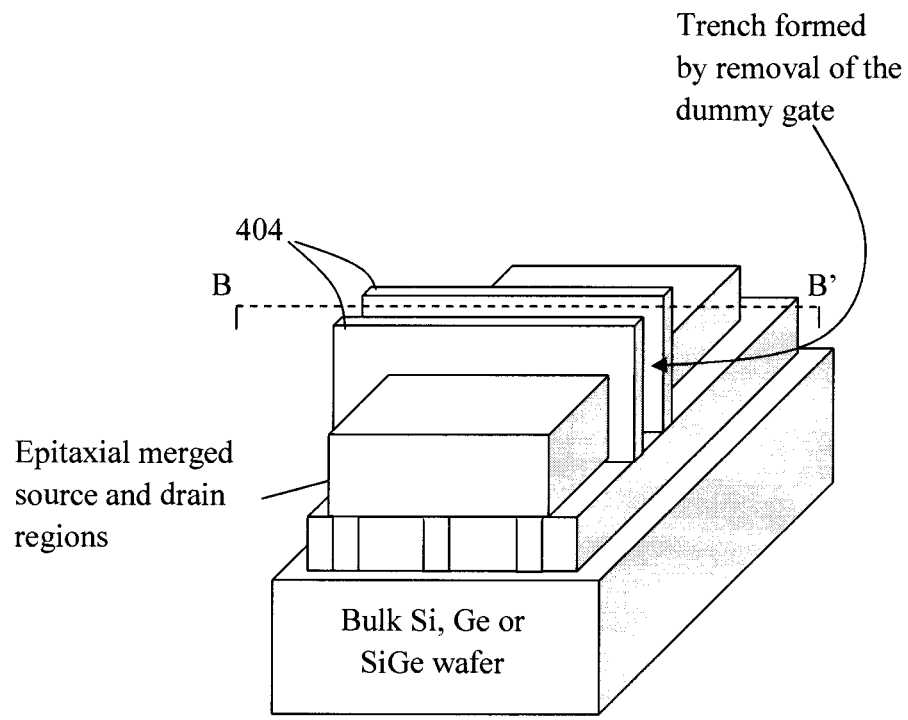
FIG. 7B is a three-dimensional diagram illustrating the dummy gate having been removed in the bulk wafer configuration according to an embodiment of the present invention.

The dummy gate 302/304 is then removed. See FIGS. 7A and 7B, respectively. FIG. 7A (which follows from FIG. 6A) depicts the SOI wafer embodiment, whereas FIG. 7B (which follows from FIG. 6B) depicts the bulk wafer embodiment. As shown in FIGS. 7A and 7B, removal of the dummy gate will result in a trench being formed between the source and drain regions (e.g., between the spacers 402/404).

According to an exemplary embodiment, the dummy gate 302/304 is removed using wet chemical etching or dry etching. As highlighted above, the dummy gate 302/304 may be formed from poly-silicon. In that case, the dummy gate 302/304 can be removed using a silicon-specific RIE process. The oxide layer 602/604 will serve to protect the source and drain regions during this etching process.

As a result of the dummy gate removal process, those portions of the fins that were once covered by the dummy gate (i.e., a channel region of the device, see above) are now exposed. Therefore, the entire surface area (e.g., sidewalls and top of each of the fins) of the fin channel region can be exposed to a high stress nitride by way of a SMT strain transfer process. This SMT process is now described in detail.

To best illustrate the SMT process the following description will now refer to depictions of a cross-sectional cut through the structure. In particular, FIGS. 8A and 8B will show a cross-sectional cut through plane A-A' or plane B-B'. See FIGS. 7A and 7B, respectively.

The SMT process involves forming a high-stress nitride film 802/804 on the exposed fins in the channel region (which can induce strain in the channel region). See FIGS. 8A and 8B. FIG. 8A (which follows from FIG. 7A) depicts the SOI wafer embodiment, whereas FIG. 8B (which follows from FIG. 7B) depicts the bulk wafer embodiment. To form the high-stress nitride film 802/804 on the fin channel region, a nitride material is first deposited onto the exposed fins in the channel region. According to an exemplary embodiment, the nitride material is silicon nitride which is blanket deposited onto the wafer, covering the fins, using a conformal deposition process, such as CVD and atomic layer deposition (ALD).

The wafer is then annealed at a temperature of from about 600 degrees Celsius (° C.) to about 1,000° C., for a duration of from about 2 minutes to about 60 minutes, to form high-stress nitride film 802/804. This annealing will induce strain in the nitride material. Further, since the nitride material is contacting all exposed surfaces of the fin channel region, the strain induced in the nitride material by the annealing step will be transferred during the annealing process to the channel region.

Specifically, as highlighted above, in a FINFET device the current flow through the channel occurs vertically along the sidewalls of the fins (see FIG. 1A, described above). Thus, in order to effectively induce stress in the channel region of a FINFET device, the sidewalls of the fins (in the channel region) have to be exposed to the high-stress nitride film. Otherwise, as highlighted above, non-uniform stress transfer will occur. Advantageously, with the present techniques, the high-stress nitride film 802/804 is formed directly on the sidewalls (and tops) of each of the fins. Therefore, according to the present process, a uniform (compressive or tensile) strain will be induced in the sidewalls of each of the fins.

The (desired) type of induced strain can vary depending on the device being formed, and thus is generally application-specific. For instance, the induction of tensile strain in the channel region can improve electron mobility but degrade hole mobility. Thus, in the case of an n-channel FET, tensile strain would be desirable. Conversely, in the case of a p-channel FET, compressive strain would be desirable. Techniques for configuring a silicon nitride material so as to impart either a compressive strain or a tensile strain therein are described, for example, in U.S. Pat. No. 7,566,655 B2, entitled "Integration Process for Fabricating Stressed Transistor Structure," issued to Balseanu et al. (hereinafter "U.S. Pat. No. 7,566,655 B2"), the contents of which are incorporated by reference herein. For example, higher compressive stress values in silicon nitride can be achieved by increasing film density by having more Si—N bonds and reducing the density of Si—H and N—H bonds in the material. Factors such as higher deposition temperatures also affect the compressive stress value of silicon nitride films. See U.S. Pat. No. 7,566,655 B2. Higher tensile stress values in silicon nitride can be achieved by reducing the net hydrogen content in the material, or the amount of silicon-hydrogen and nitrogen-hydrogen bonds (Si—H and N—H bonds) in the material. See U.S. Pat. No. 7,566,655 B2.

Thus, according to an exemplary embodiment, the makeup of the high-stress nitride film 802/804 can be tailored (for example as described in U.S. Pat. No. 7,566,655 B2) depending on whether tensile (e.g., an n-channel FET) or compressive strain (p-channel FET) is desired (e.g., a different high-stress nitride film composition (compressive or tensile stress imparting) can be used in different regions of the device). Alternatively, a single high-stress nitride film 802/804 composition may be employed in both cases. However, following removal of the high-stress nitride film 802/804 (but before the replacement gate deposition), a heavy ion implantation (e.g., at a dose of from about $3\times10^{16}$ cm$^{-2}$ to about $5\times10^{16}$ cm$^2$) of elements such as xenon (Xe) or germanium (Ge) selectively into one or more of the fins can serve to relax the stress in the fins with the implant. Thus, by way of example only, a heavy ion implantation into fins which have compressive strain (induced therein by the present techniques) will reduce the compressive strain. Similarly, a heavy ion implantation into fins which have tensile strain (induced therein by the present techniques) will reduce the tensile strain. For example, as highlighted above, tensile strain in the channel region is favorable for an n-channel FET, but not so much for a p-channel FET. Thus, a high-stress nitride film 802/804 configured to impart tensile strain can be used for both applications, followed by a heavy ion implantation to relax the tensile strain in the fin channels of the p-channel FET. Conversely, as highlighted above, compressive strain in the channel region is favorable for a p-channel FET, but not so much for an n-channel FET. Thus, a high-stress nitride film 802/804 configured to impart compressive strain can be used for both applications, followed by a heavy ion implantation to relax the compressive strain in the fin channels of the n-channel FET.

Following the SMT process, the high-stress nitride film 802/804 and the oxide layer 602/604 are stripped (removed). According to an exemplary embodiment, the high-stress nitride film 802/804 and the oxide layer 602/604 are removed using a wet etching process, such as an HF dip. The high-stress nitride film 802/804 is removed in order to permit the replacement gate to be formed (see below) and the oxide layer 602/604 is removed to allow access to the source and drain regions. However, the strain induced in the channel region remains even after the high-stress nitride film 802/804 has been removed.

A replacement gate 902/904 is then formed over/covering at least a portion of each of the fins in the channel region. See FIGS. 9A and 9B, respectively. FIG. 9A (which follows from FIG. 8A) depicts the SOI wafer embodiment, whereas FIG. 9B (which follows from FIG. 8B) depicts the bulk wafer embodiment. According to an exemplary embodiment, the replacement gate 902/904 is formed by filling the trench left by removal of the dummy gate with a gate material (so as to cover the fins). Once the gate material is filled in the trench, CMP can be used to planarize the gate material. Suitable gate materials include, but are not limited to, one or more of polysilicon, a deposited metal(s) and a hybrid stack of multiple materials such as metal polysilicon. In the example shown in FIGS. 9A and 9B, the spacers 402/404 are present on opposite sides of the replacement gate 902/904.

Source drain contacts (not shown) may be formed using conventional processes. For example, standard metal silicide contacts may be formed on the epitaxially merged source and drain regions.

In conclusion, through use of the present dummy gate/replacement gate process SMT techniques can be effectively implemented in the context of FINFET devices. Namely, with the present techniques, the whole channel is exposed to the SMT nitride for maximum strain transfer efficiency.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of fabricating a FIN field-effect transistor (FINFET) device, comprising the steps of: providing a wafer; patterning a plurality of fins in the wafer; forming a dummy gate covering a portion of the fins, wherein the portion of the fins covered by the dummy gate serves as a channel region of the device and portions of the fins extending out from under the dummy gate serve as source and drain regions of the device;
    forming spacers on opposite sides of the dummy gate;
    removing the dummy gate thus forming a trench between the spacers that exposes the fins in the channel region of the device once covered by the dummy gate;
    depositing a silicon nitride material into the trench so as to cover a top and sidewalls of each of the fins in the channel region of the device;
    annealing the wafer to induce strain in the silicon nitride material, wherein by way of the annealing the silicon nitride material is converted into a stress-induced nitride film that contacts the top and the sidewalls of each of the fins in the channel region of the device; and wherein by way of having the stress-induced silicon nitride film contact the top and the sidewalls of each of the fins in the channel region of the device, the strain induced in the silicon nitride material by the annealing will be transferred during the annealing to the channel region of the device resulting in a strain being induced in the top and the sidewalls of each of the fins in the channel region of the device;
    removing the stressed-induced silicon nitride film; wherein the strain induced in the top and the sidewalls of each of the fins in the channel region of the device remains after the stress-induced silicon nitride film is removed; and
    forming a replacement gate covering the fins in the channel region of the device.

2. The method of claim 1, further comprising the step of: thickening the portions of the fins extending out from under the dummy gate using epitaxy.

3. The method of claim 1, further comprising the step of: covering the source and drain regions of the device with an oxide layer wherein the oxide layer serves to protect the source and drain regions during the step of removing the dummy gate.

4. The method of claim 1, wherein the wafer comprises a semiconductor-on-insulator (SOI) wafer having a SOI layer over a buried oxide (BOX), and wherein the fins are patterned in the SOI layer.

5. The method of claim 4, wherein the SOI layer comprises silicon, germanium or silicon germanium.

6. The method of claim 1, wherein the wafer comprises a bulk silicon, germanium or silicon germanium wafer.

7. The method of claim 1, wherein each of the fins has a height of from about 10 nm to about 30 nm, and a width of from about 10 nm to about 25 nm.

8. The method of claim 1, wherein the step of forming the dummy gate comprises the steps of: blanket depositing a dummy gate material onto the wafer so as to cover the fins; and patterning the dummy gate material to form the dummy gate.

9. The method of claim 8, wherein the dummy gate material comprises poly-silicon.

10. The method of claim 1, wherein the spacers comprise nitride spacers.

11. The method of claim 2, wherein the epitaxy merges the portions of the fins extending out from under the dummy gate.

12. The method of claim 3, wherein the oxide layer comprises a flowable oxide.

13. The method of claim 1, wherein the dummy gate is removed using wet chemical etching or dry etching.

14. The method of claim 1, wherein the nitride material comprises silicon nitride.

15. The method of claim 1, wherein the wafer in annealed at a temperature of from about 600 .degrees C. to about 1,000 degrees C.

16. The method of claim 1, wherein the stressed nitride film is removed using a wet etching process.

17. The method of claim 1, wherein the step of forming the replacement gate comprises the steps of: filling the trench with a gate material covering the fins in the channel region of the device; and planarizing the gate material.

18. The method of claim 17, wherein the gate material comprises one or more of polysilicon, a deposited metal, and a hybrid stack of multiple materials.

* * * * *